(12) United States Patent
Khesbak et al.

(10) Patent No.: US 6,542,029 B1
(45) Date of Patent: Apr. 1, 2003

(54) VARIABLE-SLOPE VARIABLE-GAIN AMPLIFIER

(75) Inventors: Sabah Khesbak, Irvine, CA (US); Madhukar Reddy, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/686,669

(22) Filed: Oct. 11, 2000

(51) Int. Cl.[7] ................................................ H03G 3/20
(52) U.S. Cl. ...................................... 330/129; 330/130
(58) Field of Search ............................ 330/2, 129, 130, 330/131; 455/69, 127, 522

(56) References Cited

U.S. PATENT DOCUMENTS

| | | | | |
|---|---|---|---|---|
| 5,126,688 A | * | 6/1992 | Nakanishi et al. | 330/127 |
| 5,448,770 A | * | 9/1995 | Hietala et al. | 330/129 |
| 5,852,769 A | * | 12/1998 | Ahmed et al. | 455/127 |
| 5,896,064 A | * | 4/1999 | Kaku | 330/129 |
| 5,905,962 A | * | 5/1999 | Richardson | 455/522 |
| 5,926,749 A | * | 7/1999 | Igarashi et al. | 455/127 |
| 6,035,181 A | * | 3/2000 | Gross | 455/126 |
| 6,038,432 A | * | 3/2000 | Onoda | 330/129 |
| 6,057,732 A | * | 5/2000 | Morishita | 330/129 |
| 6,124,761 A | | 9/2000 | Robinson et al. | 330/254 |
| 6,271,726 B1 | * | 8/2001 | Fransis et al. | 330/279 |
| 6,327,462 B1 | * | 12/2001 | Loke et al. | 455/127 |

FOREIGN PATENT DOCUMENTS

| | | | |
|---|---|---|---|
| JP | 02000138614 A | * | 5/2000 |
| JP | 02001086010 A | * | 3/2001 |

* cited by examiner

*Primary Examiner*—Robert Pascal
*Assistant Examiner*—Khanh Van Nguyen
(74) *Attorney, Agent, or Firm*—Thomas, Kayden, Horstemeyer & Risley LLP

(57) ABSTRACT

A system for varying output power of variable-gain amplifiers (VGA) allows for varying the output power transfer function, thus varying the gain, and, hence, the resolution of the output power of the VGA. The preferred embodiment comprises a variable-slope VGA (VSVGA) circuit configured to operate within a closed-loop power-controlled CDMA handset. The VSVGA circuit manipulates the input control voltage of the VGA, thereby, adjusting the gain of the amplifier by varying the slope of a line which models the amplifier output transfer function. Varying gain of the VGA provides for a varying resolution in the VGA amplifier output transfer function. This variation allows for compatibility of a single CDMA handset with different industry standards.

19 Claims, 6 Drawing Sheets

VARIABLE-SLOPE VARIABLE-GAIN AMPLIFIER

BACKGROUND OF THE INVENTION

1. Technical Field

This invention relates to amplifiers, and more specifically to power amplifiers used in wireless communication devices.

2. Related Art

It is desirable for the base station receivers in Code Division Multiple Access (CDMA) systems to receive roughly equal power from all CDMA handsets to help eliminate "near-far problems" associated with signal transmission and reception. Near-far problems arise from the fact that signals transmitted from near CDMA handsets (e.g handsets that are close to the base station) effectively "drown out" the signal transmitted from the far CDMA handsets (e.g. handsets that are far from the base station). In order to eliminate these near-far problems, CDMA systems use power control where the base station rapidly samples the radio signal strength transmitted from each CDMA handset transmitter (e.g., each mobile unit transmitter) and then sends a power change command to the CDMA handset. The CDMA handset then adjusts the output power of its transmitter in response to the power change command by adjusting a gain, which is an incremental change in the output power associated with an incremental change in the power change command, associated with the output power of the CDMA handset. This allows the received signal at the base station from each CDMA handset transmitter to be approximately the same.

Some CDMA handsets operate in two distinct modes: open loop mode and closed loop mode. Prior to initiating a call, the CDMA handset is operating in the open loop mode. In open loop mode, the CDMA handset attempts to estimate an initial output power of the transmitter by adjusting a gain of a variable-gain amplifier in the CDMA handset. The gain is adjusted using a finite number of discrete, rather than continuous, iterations. Since, the gain resolution varies between different industry standards (e.g., the gain resolution for industry standard IS95A is different from the gain resolution for industry standard IS95B), and the desired output power is specified, this results in minimal variation of output power. Furthermore, using the same resolution for all the standards sometimes causes the minimal variation to exceed the tolerance between the output power of the CDMA handset transmitter and the expected receive power at the base station. This may lead to a gross jump in the output power of the CDMA handset transmitter to catch the next permissible power slot and, thus, may undesirably increase the output power sent to the base station. Such a gross increase in output power may increase interference to other users, which may lead to a reduction in the number of subscribers at a given moment. Therefore, there is a need in the industry to address the problem associated with different industry standards.

After initiating the call, the CDMA handset switches from open-loop mode to closed-loop mode. In closed-loop mode, it is desirable to change the gain of the radio frequency (RF) circuitry at different output levels to accommodate a good signal-to-noise ratio. These changes in the gain of the RF circuitry are often abrupt and cause nonlinearity in the output power. This condition may result in a sudden jump in the output power of the handset rather than a smooth increase. These sudden jumps on the output power may further result in excess output power, that in turn, undesirably increases the output power of the CDMA handset transmitter. Such increases in output power may create more interference and, hence, fewer subscribers are able to connect at any given time. Therefore, there is an unaddressed need in the industry to compensate for these abrupt changes in the gain of the RF circuitry.

SUMMARY OF THE INVENTION

The invention provides a variable-slope, variable-gain amplifier (VSVGA) system and method for efficiently and accurately varying amplifier output power. In the preferred embodiment, a VSVGA circuit is employed in a Code Division Multiple Access (CDMA) handset transmitter. Specifically, the VSVGA circuit allows for varying the slope of a line which models the output power transfer function, thus varying the amplifier gain and, hence, the resolution of the output power of a variable-gain amplifier (VGA).

Briefly described, the CDMA handset is configured to receive power change signals from a base station and, in response to those power change signals, to adjust the output power of the CDMA handset transmitter using a control signal that varies the gain of the VGA. By varying the amplifier input control voltage to output power transfer function, which may be approximated by a straight line having a slope which may be varied, the gain of the amplifier can be varied. This adjustment in the gain allows for manipulation of the resolution of the output power.

The CDMA handset comprises the VSVGA circuit in addition to the basic components of a closed-loop power-controlled CDMA handset (e.g. VGA circuitry, one or more mixers, local oscillators, filtering and other processing circuitry, driver circuitry, power amplifier circuitry, conversion circuitry, and an antenna). The VSVGA circuit is configured to manipulate the input control voltage of the VGA, thus, adjusting the gain of the amplifier by varying the slope of the amplifier output.

The invention can also be viewed as providing a method for varying the output power transfer function (gain) of a power amplifier. The method can be broadly conceptualized by the following steps: receiving a system change command (e.g. a command to determine whether the CDMA handset is an IS95A, IS95B, or WCDMA standard) at a mobile unit from a base station and adjusting the output power gain resolution of the amplifier by varying the output power transfer function, as approximated by varying the slope of a straight line corresponding to the output power transfer function. The method may further include the step of linearizing a nonlinear output power of a CDMA handset transmitter in response to abrupt change in the gain of the transmitter's radio-frequency (RF) circuit.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can better be understood with reference to the following figures. The components in the figures are not necessarily to scale, emphasis instead being placed upon illustrating the principles of the invention. Moreover, in the figures, like reference numerals designate corresponding parts throughout the different views. Such elements bearing the same reference numerals may be considered to be like elements, however, since these like numeraled elements are incidental to the operation of the present invention which utilizes existing portions of a CDMA handset transmitter, one skilled in the art will realize that like numeraled elements among the several FIGs. need not be identical, as any variations of such elements will not adversely affect the functioning and performance of the present invention. Furthermore, like elements that are like-numbered may be described in detail only in the first instance of occurrence, and not described in detail again when occurring in subsequent FIGs.

DETAILED DESCRIPTION OF THE PREFERRED EMBODIMENT

Figure 1:
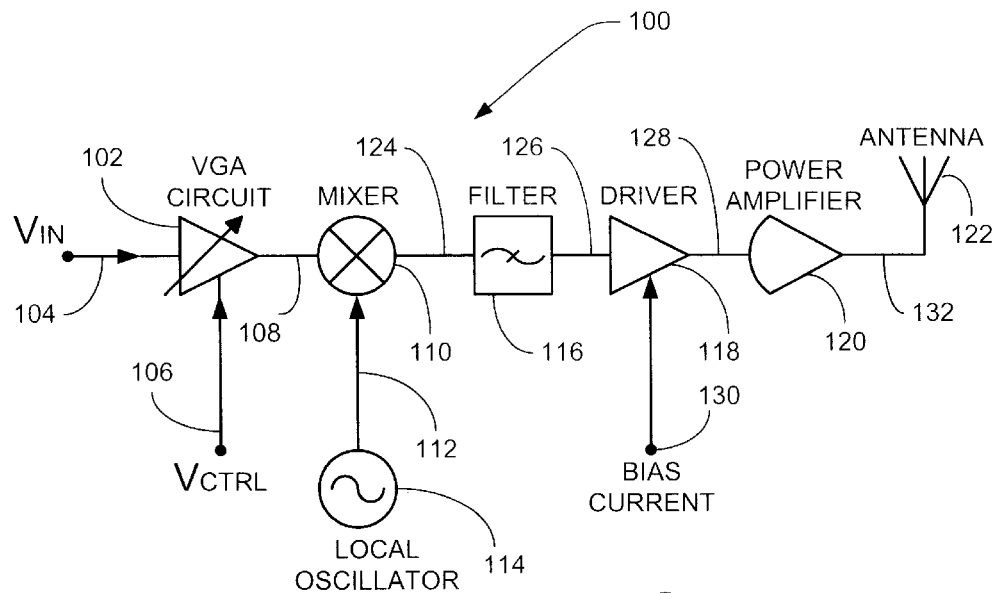
FIG. 1 is a block diagram illustrating an example environment of a Code Division Multiple Access (CDMA) handset transmitter found in the prior art.

FIG. 1 illustrates a simplified example environment of a mobile unit (e.g. Code Division Multiple Access (CDMA) handset) transmitter 100 of a wireless telecommunications system (e.g., CDMA system). The transmitter 100 of a CDMA handset comprises a variable-gain amplifier (VGA) circuit 102 configured to amplify an input signal, $V_{in}$, on connection 104. The level of amplification is controlled by an input control voltage, $V_{ctrl}$, on connection 106. The resulting amplified output signal $V_{out}$, on connection 108 is thus a function of the input signal $V_{in}$ and the input control voltage $V_{ctrl}$.

The CDMA handset transmitter 100 further comprises one or more mixers 110 for mixing the amplified output signal $V_{out}$, on connection 108 from the VGA circuit 102 to radio frequencies (RF) produced by local oscillators 114 at one or more stages on connection 112. In addition to the mixers, the CDMA handset transmitter 100 further comprises filtering and other processing circuitry 116, driver circuitry 118, power amplifier circuitry 120, and antenna 122. The filtering and other processing circuitry 116 may be configured to band limit and process the mixed signal on connection 124 from the mixer 110 and produce a filtered and processed signal on connection 126. The driver circuitry 118 then receives the filtered and processed signal on connection 126 from the filtering and other processing circuitry 116, and produces a driving signal on connection 128 responsive to a bias current 130 provided as a control to the input of the driver circuitry 118. This driving signal on connection 128 drives the power amplifier circuitry 120.

The power amplifier circuitry 120 of the CDMA handset transmitter 100 then generates an output signal on connection 132, which is then provided to antenna 122 for transmission. Antenna 122 transmits the signal (not shown) over a wireless communication interface (not shown) to another component of a wireless communication system, such as a base station (not shown). Examples of filtering and other processing circuitry 116, driver circuitry 118, power amplifier circuitry 120, and antenna 122 are discussed in U.S. patent application Ser. No. 09/328,927, filed Jun 9, 1999, "POWER AMPLIFIER DRIVER SYSTEM FOR WIRELESS HANDSET," that is fully incorporated by reference.

Figure 2:
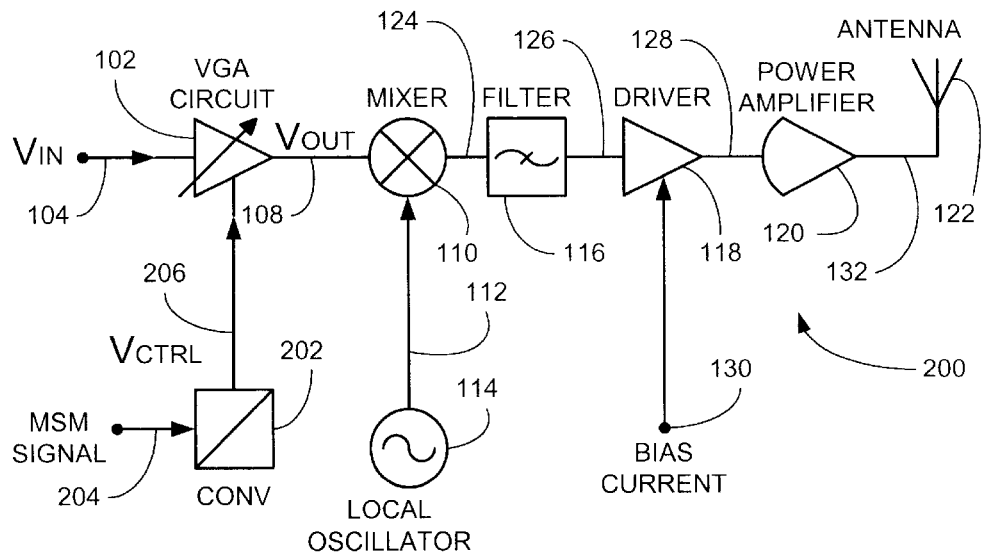
FIG. 2 is a block diagram illustrating the CDMA handset transmitter of FIG. 1 found in the prior art having a conversion circuit configured to convert a mobile base station modem (MSM) signal to a control signal when the CDMA handset is operating in closed-loop mode.

FIG. 2 illustrates an example environment of a CDMA handset transmitter 200 employing a closed-loop power-control technique to avoid near-far problems in a wireless communication system. The exemplar CDMA handset transmitter 200 comprises the same basic components of CDMA handset transmitter 100 (FIG. 1), including VGA circuit 102, one or more mixers 110, filtering and other processing circuitry 116, driver circuitry 118, power amplifier circuitry 120, antenna 122, and local oscillator 114. Additionally, the CDMA handset transmitter 200 comprises a conversion circuit 202 configured to receive a mobile base station modem (MSM) signal over connection 204 from a base station (not shown) and convert the MSM signal to the input control voltage, $V_{ctrl}$, onto connection 206. $V_{ctrl}$ controls the amplified output signal $V_{out}$, on connection 108, of the VGA circuit 102. The MSM signal on connection 204 is generated in response to closed-loop power-control commands, which are a function of the CDMA handset's distance with respect to the base station (not shown). Additional detail on the conversion circuit 202 is provided in U.S. patent application Ser. No. 09/163,885, filed Sep. 30, 1998, "VARIABLE GAIN AMPLIFIER WITH GAIN LINEAR WITH CONTROL VOLTAGE," that is fully incorporated by reference.

Figure 3:
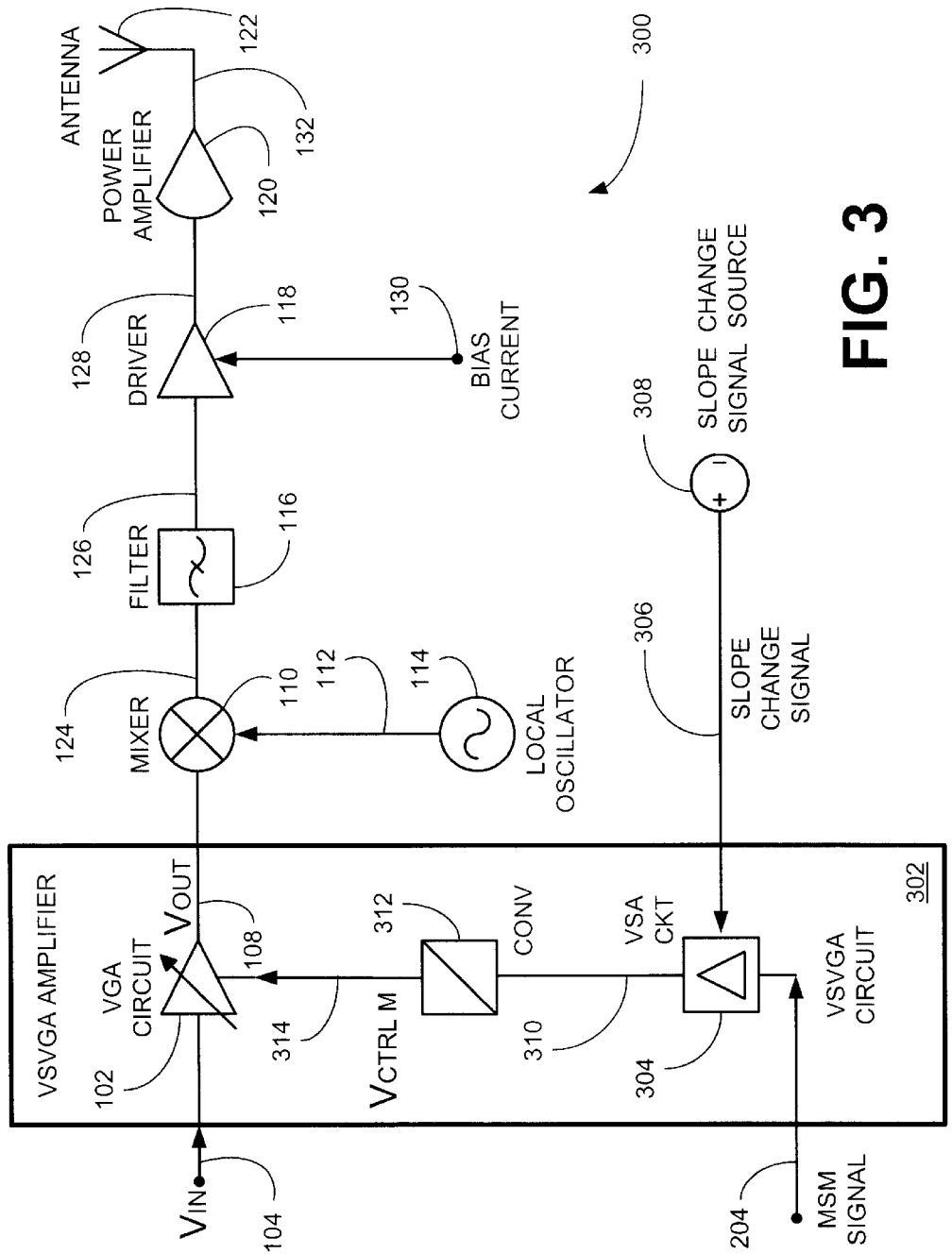
FIG. 3 is a block diagram illustrating a variable-slope variable-gain amplifier (VSVGA) circuit in accordance with the present invention, incorporated into the example CDMA handset transmitter of FIG. 2.
Figure 4:
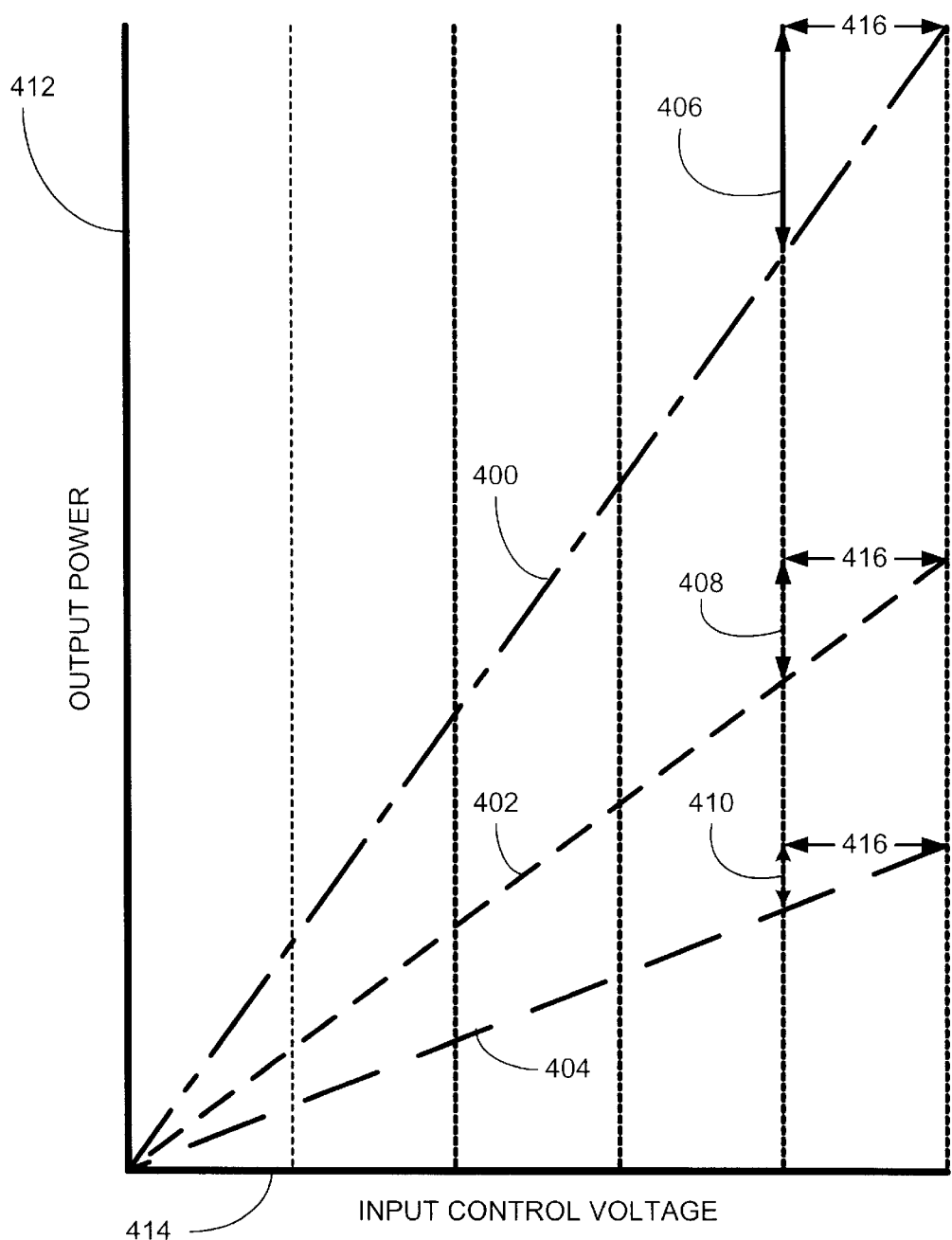
FIG. 4 is a graph of the output power as a function of the input control voltage illustrating the effect that variable slopes have on gain resolutions of the output power.

FIG. 3 illustrates a CDMA handset transmitter 300 further comprising a variable-slope variable-gain amplifier (VSVGA) circuit 302 in accordance with the invention. A variable-slope amplifier (VSA) circuit 304 is configured to receive a slope change signal on connection 306 from a slope change signal source 308, along with the MSM signal on connection 204. This allows the VSA to manipulate the MSM signal, thus, producing a modified MSM signal on connection 310 that is supplied to the conversion circuit 312. This, in turn, produces a modified input control voltage, $V_{ctrl_m}$, on connection 314 which is then supplied to the VGA circuit 102. The amplified output signal $V_{out}$ on connection 108 is now a function of the input signal, $V_{in}$, and the modified input control voltage, $V_{ctrl_m}$. Thus, a careful fashioning of the modified input control voltage, $V_{ctrl_m}$, provides for adjustment of the VGA circuit 102 output power transfer function. For example, the output power transfer function of the VSGA amplifier 302 may be represented by the lines 400, 402 and 404 (FIG. 4). Each of the lines 400, 402 and 404 have differing slopes. Depending on the operating conditions and the output power transfer function of the VGA circuit 102, as specified according to lines 400, 402 and 404, the change in output power for a predefined change in input control voltage may be adjusted (equivalent to adjusting the slope of a line which models the amplifier output power transfer function, hence, the variable gain-slope). For example, when the VGA circuit 102 is operating with a transfer function corresponding to line 400, a specified input control voltage change 416 will result in a change in output power 406. When the VGA circuit 102 is operating according to a transfer function corresponding to line 402, the input control voltage change 416 results in an output power change 408. Likewise, when the VGA circuit 102 is operating with a transfer function corresponding to line 404, the input control voltage change 416 results in an output power change 410. The VSA circuit 304 combined with the VGA circuit 102 and the conversion circuit 312 comprise the variable-slope variable-gain amplifier (VSVGA) circuit 302.

The operation of the VSVGA circuit is illustrated in more detail in FIG. 4. FIG. 4 is a graph illustrating the effect of varying the output power transfer function of the CDMA handset transmitter 300 (FIG. 3). Here, the output power transfer function, which specifies the relationship between the input control voltage and the output power of the VSVGA amplifier 302, is varied according to the exemplar lines 400, 402 and 404, each line having a different slope. In one embodiment, the output power transfer function can be set to a plurality of predefined values, such as the exemplar lines 400, 402 and 404. Another embodiment provides for a continuous change in the output power transfer function (modeled by a line having a continuous range of slopes.) Thus, it can be said that the gain (output power transfer function) of the VSVGA amplifier 302 is seen to be represented as a line having a variable slope.

In the illustrative example shown by the graph of FIG. 4, the output power 412 is plotted as a linear function of the input control voltage 414. Given this linear relationship between the output power 412 and the input control voltage 414, lines 400, 402 and 404 (having a slope as shown in FIG. 4) illustrate a corresponding output power change 406, 408 and 410 for a given input control voltage increment 416. If a line modeling the output power transfer function has a large slope, as indicated by line 400, then a correspondingly large change in output power 406 is produced for a given input control voltage increment 416 of the input control voltage 414. Thus, the output power can be said to have a coarse resolution (large change). Reducing the large slope (illustrated by line 400) to a smaller slope (illustrated by line 402) produces a corresponding reduction in the output power 408, and thus, a finer resolution (smaller change) of the output power 412 as a function of the input control voltage 414. Further reduction of the slope (illustrated by line 404) reduces the output power 410 even further. Thus, the resolution of the output power changes 406, 408, and 410 can be manipulated by varying the slope of lines 400, 402 and 404 which correspond to the output power 412 with respect to the input control voltage 414. This adjustment in the slope of a line representing the relationship of the output power 412 versus the input control voltage 414 (illustrated by lines 400, 402 and 404) is achieved by the VSVGA circuit 302 (FIG. 3).

Figure 5:
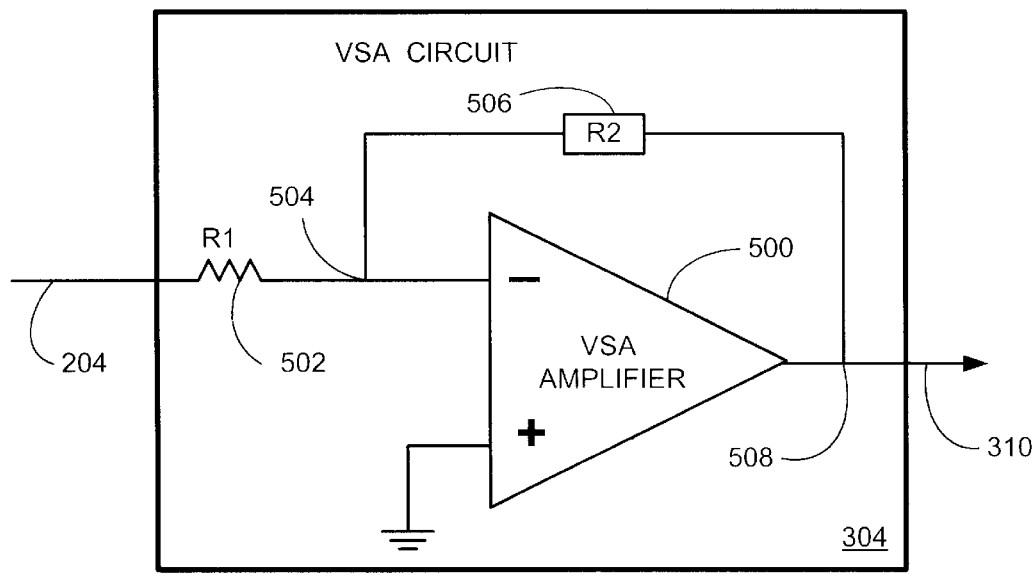
FIG. 5 is a circuit diagram illustrating an example variable-slope amplifier (VSA) circuit configured to produce the variable slope in the variable-gain amplifier (VGA) of FIG. 3.

FIG. 5 illustrates an example VSA circuit 304 (see also FIG. 3) used to ultimately produce the modified input control voltage, $V_{ctrl_m}$, from the MSM signal on connection 204 (FIGS. 2 and 3). The VSA circuit 304 is illustrated as a simple, negative-feedback amplifier having a VSA amplifier 500 with a fixed resistor 502 (R1) at the negative input node 504 of the VSA amplifier 500 and a variable resistor 506 (R2) connecting the negative input node 504 and the output node 508 of the VSA amplifier 500. VSA amplifier 500 may be a commonly available operational amplifier selected according to the particular requirements of the device in which the invention is utilized. VSA amplifier 500 may alternatively be a specially fabricated amplifier or other similar functioning electrical device. This configuration allows for fashioning of the modified MSM signal on connection 310. Hence, the modified input control voltage, $V_{ctrl_m}$ on connection 314 (FIG. 3), may be varied as a function of the MSM signal on connection 310. Equation 1 below specifies the relationship between $V_{ctrl_m}$, fixed resistor 502 (R1) and variable resistor 506 (R2). Accordingly, equation 1 is as follows:

$$V_{ctrl_m} = \left[-\left(\frac{R2}{R1}(Signal_{MSM})\right)\right] \otimes [f(Circuit_{Conversion})]. \quad [1]$$

Although an operational amplifier 500 is used to produce the modified input control voltage $V_{ctrl_m}$ on connection 314 (FIG. 3) in the preferred embodiment, it would be obvious that the modified input control voltage $V_{ctrl_m}$ on connection 314 may be generated using any number of different circuits that allow for manipulation of signals. Moreover, although the embodiment above illustrates a VSVGA circuit 302 (FIG. 3) for producing a linear output as a function of a given input, the output characteristics may be manipulated in various ways to produce nonlinear, as well as linear outputs. These variations may be determined and implemented using well known techniques commonly employed in the art of amplifier design and control. It is intended that all such variations operating in accordance with the present invention be within the scope of this disclosure and to be protected by the accompanying claims.

Figure 6:
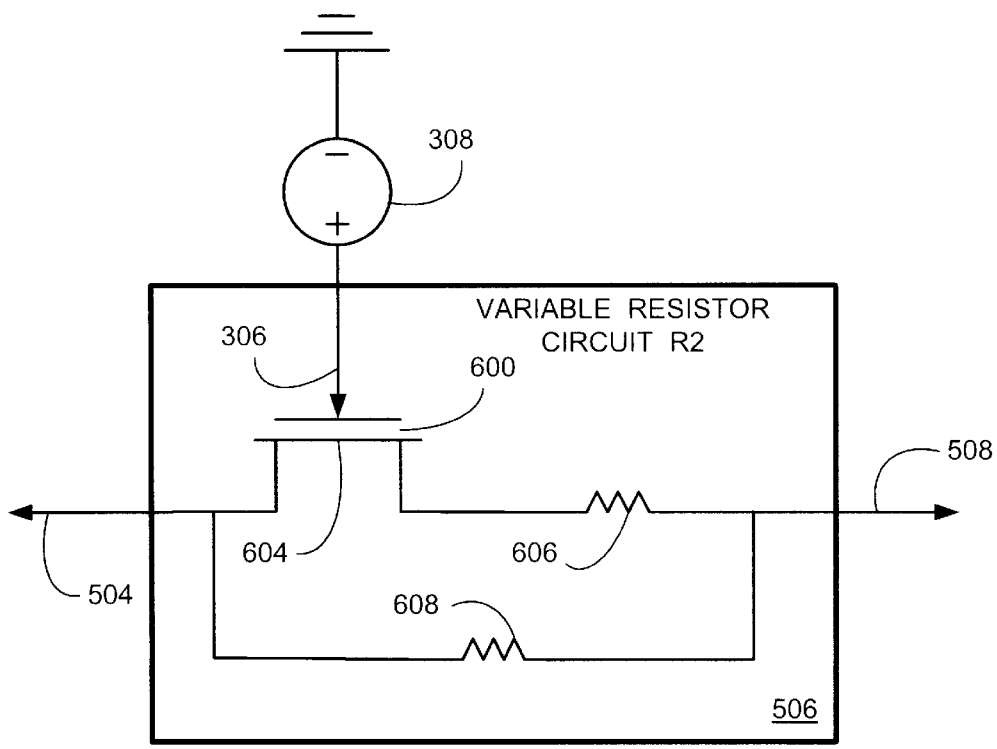
FIG. 6 is a circuit diagram illustrating an example VSA circuit configured to produce a variable resistance in the circuit of FIG. 5.

FIG. 6 illustrates an example circuit configured to produce the variable resistor 506 (see also FIG. 5) for use in the VSA circuit 304 (FIG. 5). This embodiment shows a negative-channel metal-oxide semiconductor (NMOS) transistor 600 connected to a slope change signal source 308 (see also FIG. 3) that supplies the slope change signal on connection 306, which controls the gate 604 of the transistor 600. The transistor 600 and fixed resistors 606 and 608 comprise the variable resistor 506. Transistor 600 may be a commercially available transistor, or may be a specially fabricated transistor, or may be a similar electrical device which performs substantially the same functionality of the transistor 600 as described below.

The variable resistor 506 may be configured to connect to the negative input node 504 and output node 508 of the operational amplifier 500 (FIG. 5). The resistance of the variable resistor 506 can be varied step-wise by using the transistor 600 as a switch, or varied continuously by operating the transistor 600 in its linear region. The variable resistance of (R2) 506 (FIG. 5) results in a cascading effect of varying the modified input control voltage $V_{ctrl_m}$ 314 that varies the amplified output signal $V_{out}$ 108 (FIG. 3), thus, resulting in variable gains such as shown by the slopes of lines 406, 408 and 410 (FIG. 4).

Although this embodiment shows an NMOS transistor 600 employed in a circuit (FIG. 6) functioning as the variable resistance 506 (FIGS. 5 and 6) to the VSA circuit 304 (FIG. 5), the variable resistance can be supplied through various other devices and methods. Those devices and methods, which may be implemented using well-known techniques commonly employed in the art of implementing variable resistors, are too numerous to describe in detail and will not be discussed further. It is intended that all such variations employing a variable resistive component employed in the present invention be within the scope of this disclosure and to be protected by the accompanying claims.

Figure 7:
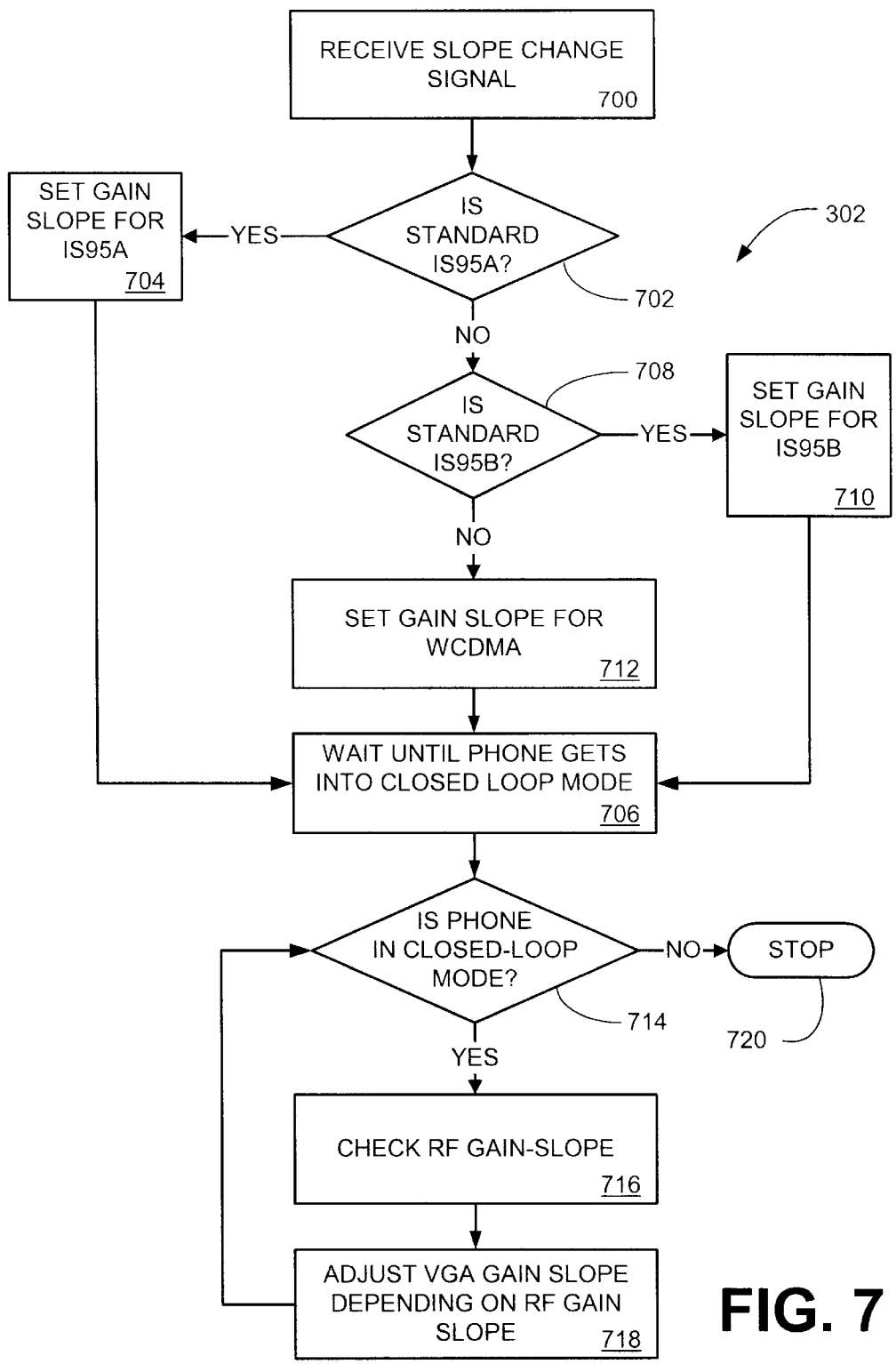
FIG. 7 is a flow chart illustrating the operation of the CDMA handset transmitter configured to vary the slope of the output power in open-loop and closed-loop mode.

An example method is illustrated in FIG. 7 to show how a CDMA handset can be configured to operate in connection with different industry standards. In step 700, the VSVGA circuit 302 (FIG. 3) receives a slope change signal on connection 306 (FIG. 3) from the slope change signal source 308. The VSVGA circuit 302 (FIG. 3) of the CDMA handset transmitter 300 (FIG. 3) then evaluates in step 702, whether the standard is, for example, IS95A. If the standard is identified to be IS95A, then in step 704, the CDMA handset transmitter 300 (FIG. 3) sets the gain-slope for the IS95A standard and proceeds to step 706 where it waits until the CDMA handset transmitter 300 (FIG. 3) is operating in the closed-loop mode. If, on the other hand, the standard is not IS95A, then the CDMA handset proceeds to step 708 where it evaluates whether the standard is IS95B. If the standard is identified to be IS95B, then, in step 710, the CDMA handset transmitter 300 (FIG. 3) sets the gain-slope for the IS95B standard and proceeds to step 706 where it waits until the CDMA handset is operating in the closed-loop mode. If neither the IS95A nor the IS95B standards are identified in steps 702 and 708, then the gain-slope for the CDMA handset transmitter 300 (FIG. 3) is set for wide-band CDMA (WCDMA) 712 and the CDMA handset proceeds to step 706 where it waits until the CDMA handset is operating in the closed-loop mode. Although only a few standards (e.g, IS95A, IS95B, and WCDMA) are identified in this embodiment, the method illustrated in FIG. 7 may be configured to evaluate other standards not specifically mentioned here. Furthermore, the method illustrated in FIG. 7 may be configured to evaluate fewer standards or more standards than the embodiment shown. It is intended that all such variations utilizing different standards, more standards or less standards than the embodiment according to FIG. 7 be within the scope of the present disclosure and to be protected by the accompanying claims.

Continuing, step 714 evaluates whether the CDMA handset is operating in the closed-loop mode. If the telephone is determined to be in closed-loop mode (step 714), then step 716 checks the RF gain-slope. Upon checking the RF gain-slope (step 716), the CDMA handset then adjusts the VGA gain-slope (step 718) as a function of the RF gain-slope of step 716. The CDMA handset then loops back to step 714 where it evaluates whether the telephone is still operating in the closed-loop mode. The call is terminated in step 720 when the telephone is no longer operating in the closed-loop mode.

One advantage of the VSVGA circuit 302 (FIG. 3) in accordance with the present invention is its ability to work with different industry standards. For example, since the gain resolution of IS95A and IS95B differ, a VSVGA circuit 302 (FIG. 3) would allow for the use of the same amplifier in two different standards. This results in the use of the same block in a multi-standard die, thus, saving the area and the cost of the die. This accommodation of different standards in one defined hardware architecture allows switching from one standard to another without increasing interference. Although only two standards are illustrated, VSVGA circuit 302 (FIG. 3) could be configured to accommodate numerous differing standards, referred to herein as gain resolution standards.

Another advantage of the VSVGA circuit 302 (FIG. 3) is the ability to compensate for changes in the gain of the radio-frequency (RF) circuitry during switching. This advantage is illustrated in FIG. 8.

Figure 8:
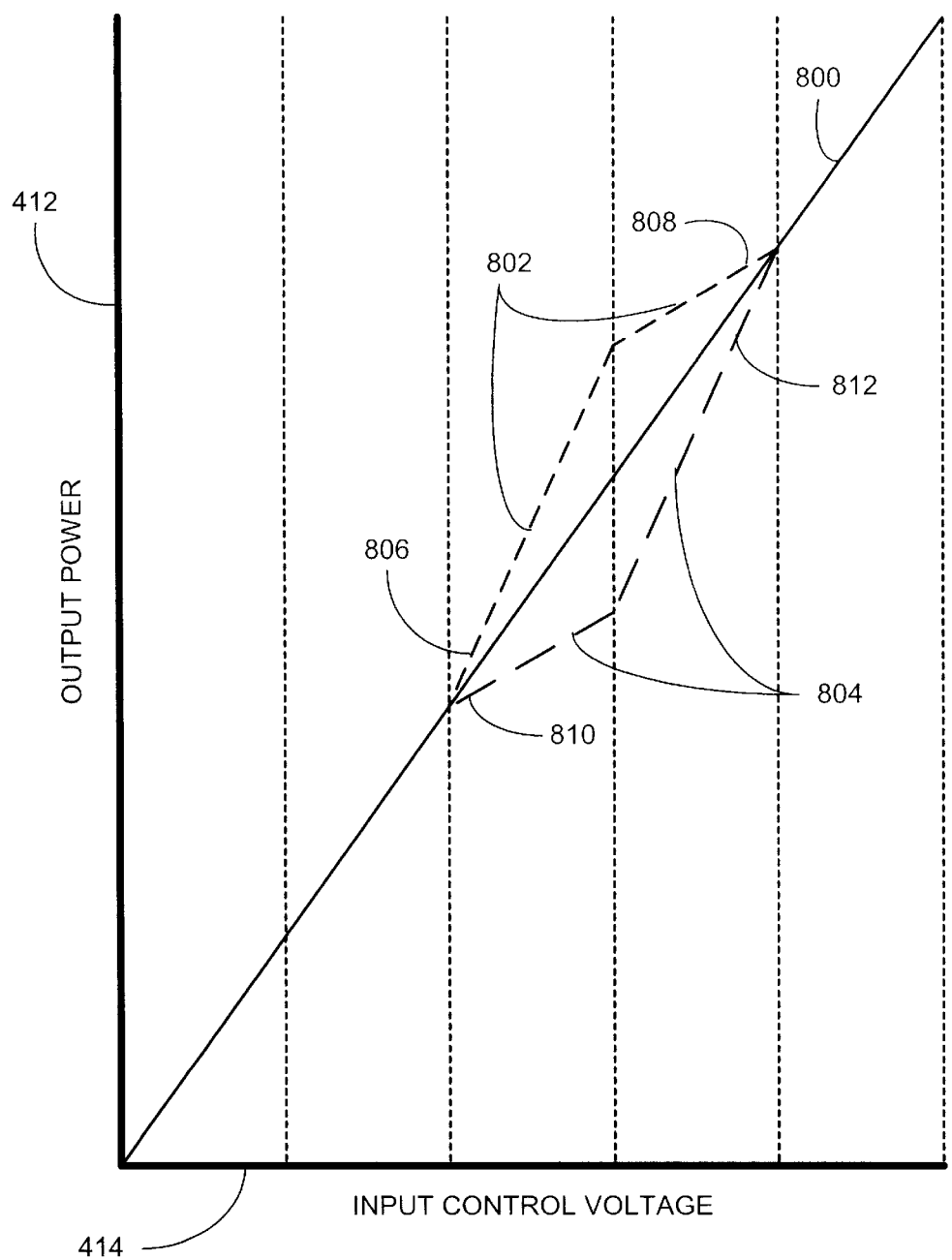
FIG. 8 is a graph illustrating abrupt variations in the gain of the radio-frequency (RF) circuitry that can be compensated by commensurate changes in the gain of the intermediate frequency (IF) circuitry.

FIG. 8 illustrates a line 800 corresponding to the characteristic total slope associated with the CDMA handset transmitter 300 output power. The total slope line 800 is the sum total of the RF circuitry slope line 802 and an intermediate-frequency (IF) circuitry slope line 804. Often, in closed-loop mode, it is desirable to change the gain of the RF circuitry at different output levels to accommodate a good signal-to-noise ratio. These changes in the gain of the RF circuitry are often abrupt and cause nonlinearity in the output power. This nonlinearity is depicted in FIG. 8 by the RF circuitry having a slope line 802. During different stages, the RF circuitry slope line 802 can abruptly increase, as illustrated by the straight line 806, or abruptly decrease, as illustrated by the line 808, thus causing abrupt nonlinearities in the total slope line 800 (effect of changes on total slope line 800 not shown). Since the total slope line 800 equals the sum total of the RF circuitry slope line 802 and the IF circuitry slope line 804, the abrupt increase in slope shown by slope line 806 in the RF circuitry can be compensated by a commensurate decrease, in slope, shown by slope line 810 in the IF circuitry. Similarly, the abrupt decrease of slope line 808 can be compensated by a commensurate increase corresponding to slope line 812. The ability to produce these commensurate changes, illustrated by slope lines 810 and 812, in the IF circuitry slope line 804 allows for the maintenance of linearity in the total slope line 800 of the output power. The VSVGA circuit 302 (FIG. 3) of this invention allows the CDMA handset transmitter 300 (FIG. 3) to adjust its IF circuitry slope line 804 to compensate for abrupt changes in its RF gain (as illustrated by slope line 802). This reduces the sudden changes in the output power, which, in turn, maintains linearity, thus, resulting in less interference and, hence, more subscribers connected at any given time. Another advantage of the VSVGA circuit is that it eases the design of a CDMA handset by saving on extra parts on the telephone board that may be required to offset the variation of the RF circuitry.

A CDMA handset is used to illustrate the preferred embodiment of the present invention. However, it will be obvious to one of ordinary skill in the art that the VSVGA circuit in accordance with the present invention can be implemented in other wireless telecommunication systems, including those that implement modulation schemes that are different than CDMA. While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for varying output of power amplifiers, comprising the steps of:
   receiving a mobile base station modem (MSM) signal;
   specifying a gain resolution standard;
   receiving a power change signal;
   generating a slope change signal in response to the power change signal, the slope change signal corresponding to the gain resolution standard; and
   adjusting an amplifier output power transfer function of a variable gain amplifier according to the slope change signal.

2. The method of claim 1, wherein the step of adjusting the amplifier output power transfer function further comprises the step of varying the amplifier output power transfer function in response to an intermediate frequency signal.

3. The method of claim 1, wherein the step of adjusting the amplifier output power transfer function further comprises the step of varying the amplifier output power transfer function in response to the MSM signal.

4. The method of claim 1, further comprising the step of controlling a resistance of a variable resistor such that the step of adjusting the amplifier output power transfer function corresponds to the resistance of the variable resistor.

5. The method of claim 4, further comprising the step of controlling a current in the variable resistor such that a first portion of the current flows through a transistor coupled to a first resistor, and such that a second portion of the current flows through a second resistor, the second resistor coupled parallel to the transistor and the first resistor, wherein the current determines the resistance of the variable resistor.

6. The method of claim 1, further comprising the step of amplifying a radio frequency (RF) signal with the variable gain amplifier according to the amplifier output power transfer function.

7. A system for varying output power of power amplifiers, comprising:

a variable-slope variable-gain amplifier (VSVGA) circuit having a variable gain amplifier, the VSVGA circuit configured to adjust an output power transfer function of the variable-gain amplifier in response to a slope change signal;

a variable-slope amplifier (VSA) circuit configured to receive a mobile base station modem (MSM) signal and the slope change signal, the VSA circuit further configured to produce a modified MSM signal as a function of the MSM signal and the slope change signal;

a slope change signal source coupled to the VSA circuit and configured to produce the slope change signal; and a conversion circuit coupled to the variable gain amplifier and the VSA circuit, and configured to receive the modified MSM signal, configured to produce a modified input control signal and further configured to transmit the modified input control signal to the variable gain amplifier such that the variable gain amplifier circuit produces an output signal as a function of the modified MSM signal.

8. The system of claim 7, wherein the variable gain amplifier is an operational amplifier.

9. The system of claim 7, wherein the VSA circuit further comprises:

a VSA amplifier;

a fixed resistor coupled to a negative input node of the VSA amplifier; and a variable resistor circuit having a resistance and coupled to the negative input node of the VSA amplifier and an output node of the VSA amplifier such that the VSA amplifier is configured as a negative feedback loop.

10. The system of claim 9, wherein the variable resistor circuit further comprises:

a variable resistor circuit transistor coupled to the slope change signal source;

a first resistor coupled to the output of the variable resistor circuit transistor and the VSA amplifier; and a second resistor coupled in parallel to the first resistor and the VSA amplifier, such that the resistance of the variable resistor circuit is varied in response to the slope change signal received from the slope change signal source.

11. A system for varying output of power amplifiers, comprising:

means for receiving a mobile base station (MSM) signal;

means for specifying a gain resolution standard;

means for receiving a power change signal;

means for generating a slope change signal in response to the power change signal, the slope change signal corresponding to the gain resolution standard; and means for adjusting an amplifier output power transfer function of a variable gain amplifier according to the slope change signal.

12. The system of claim 11, wherein the means for adjusting the amplifier output power transfer function further comprises means for varying the amplifier output power transfer function in response to an intermediate frequency signal.

13. The system of claim 11, wherein the means for adjusting the amplifier output power transfer function further comprises means for varying the amplifier output power transfer function in response to the MSM signal.

14. The system of claim 11, further comprising means for controlling a resistance of a variable resistor such that the means for adjusting the amplifier output power transfer function corresponds to the resistance of the variable resistor.

15. The system of claim 14, further comprising means for controlling a current in the variable resistor such that a first portion of the current flowing through a transistor coupled to a first resistor, and such that a second portion of the current flowing through a second resistor, the second resistor coupled parallel to the transistor and the first resistor, wherein the current determines the resistance of the variable resistor.

16. The system of claim 11, further comprising means for amplifying a radio frequency (RF) signal with the variable gain amplifier according to the amplifier output power transfer function.

17. A system for transmitting signals in a mobile communication device, comprising:

a transmitter configured to convert an electrical signal to a radio frequency (RF) signal;

a variable-slope variable-gain amplifier (VSVGA) circuit residing in the transmitter, the VSVGA circuit having a variable gain amplifier, the VSVGA circuit configured to produce a variable output power in response to a slope change signal such that a power of the RF signal varies according to the variable output power of the VSVGA circuit;

a variable-slope amplifier (VSA) circuit configured to receive a mobile base station modem (MSM) signal and the slope change signal, the VSA circuit further configured to produce a modified MSM signal as a function of the MSM signal and the slope change signal;

a slope change signal source coupled to the VSA circuit and configured to produce the slope change signal; and a conversion circuit equaled to the variable gain amplifier and the VSA circuit, and configured to receive the modified MSM signal, produce a modified input control signal and transmit the modified input control signal to the variable gain amplifier such that the variable gain amplifier circuit produces the output signal as a function of the modified MSM signal.

18. The system of claim 17, wherein the mobile communication device is a Code Division Multiple Access (CDMA) handset.

19. The system of claim 17, wherein the mobile communication device is a cell phone.

* * * * *